Figure 1:
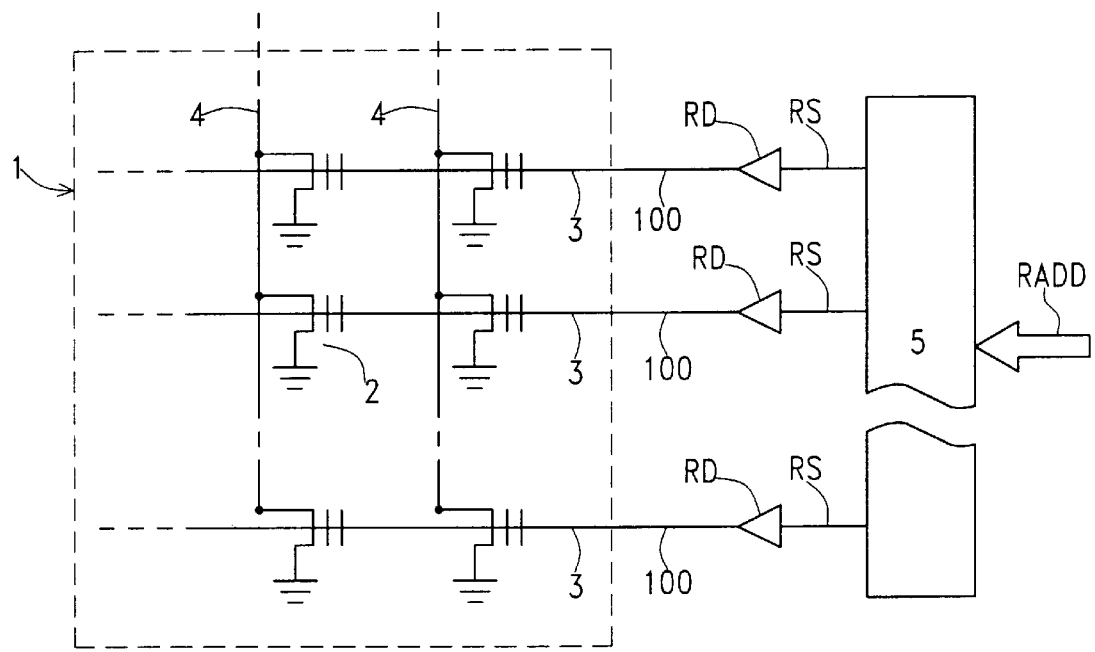

United States Patent [19]
Brambilla et al.

[11] Patent Number: 5,976,933
[45] Date of Patent: Nov. 2, 1999

[54] PROCESS FOR MANUFACTURING AN INTEGRATED CIRCUIT COMPRISING AN ARRAY OF MEMORY CELLS

[75] Inventors: Claudio Brambilla, Concorezzo; Manlio Sergio Cereda, Lomagna; Giancarlo Ginami, Bergamo, all of Italy

[73] Assignee: SGS-Thomson Microelectronics S.r.l., Agrate Brianza, Italy

[21] Appl. No.: 08/897,799

[22] Filed: Jul. 21, 1997

[30] Foreign Application Priority Data

Jul. 16, 1997 [EP] European Pat. Off. ............ 97830359

[51] Int. Cl.⁶ .................................................. H01L 21/8247
[52] U.S. Cl. ............................................ 438/257; 438/238
[58] Field of Search ..................... 438/238–242, 438/250–262, 267, 381, 393–398

[56] References Cited

U.S. PATENT DOCUMENTS

| | | | |
|---|---|---|---|
| 5,013,674 | 5/1991 | Bergemount | 437/43 |
| 5,538,912 | 7/1996 | Kunorl et al. | |
| 5,716,864 | 2/1998 | Abe | |

OTHER PUBLICATIONS

European Search Report from European application No. 97830359, filed Jul. 16, 1997.
Patent Abstracts of Japan, vol. 016, No. 240 (E–1211), Jun. 3, 1992 & JP 04 049675, Feb. 19, 1992.
Patent Abstracts of Japan, vol. 097, No. 003, Mar. 31, 1997 & JP 08 298314, Nov. 12, 1996.

*Primary Examiner*—Jey Tsai
*Attorney, Agent, or Firm*—Wolf, Greenfield & Sacks, P.C.

[57] ABSTRACT

A process for manufacturing an integrated circuit comprising an array of memory cells, providing for: a) forming in a memory cell array area of a semiconductor layer (6) an active area for the memory cells; b) forming over said active area for the memory cells a gate oxide layer (8); c) forming over the whole integrated circuit a first layer of conductive material (9); d) forming over the first layer of conductive material (9) a layer of insulating material (10); e) removing the layer of insulating material (10) from outside the memory cell array area; f) forming over the whole integrated circuit a second layer of conductive material (11) which in the memory cell array area is separated from the first layer of conductive material (9) by the insulating material layer (10), while outside the memory cell array area is directly superimposed over said first layer of conductive material (9); g) inside the memory cell array area, defining first strips (22) of the second layer of conductive material (11) for forming rows (3) of the memory cell array (1), and outside the memory cell array area defining second strips (17) of the second layer of conductive material (11) for forming interconnection lines (100) for electrically interconnecting the rows (3) of the memory cell array with a circuitry (5,RD) said, first strips (22) and the second strips (17) of the second layer of conductive material (11) are automatically joined at respective ends thereof at said boundary region.

29 Claims, 11 Drawing Sheets

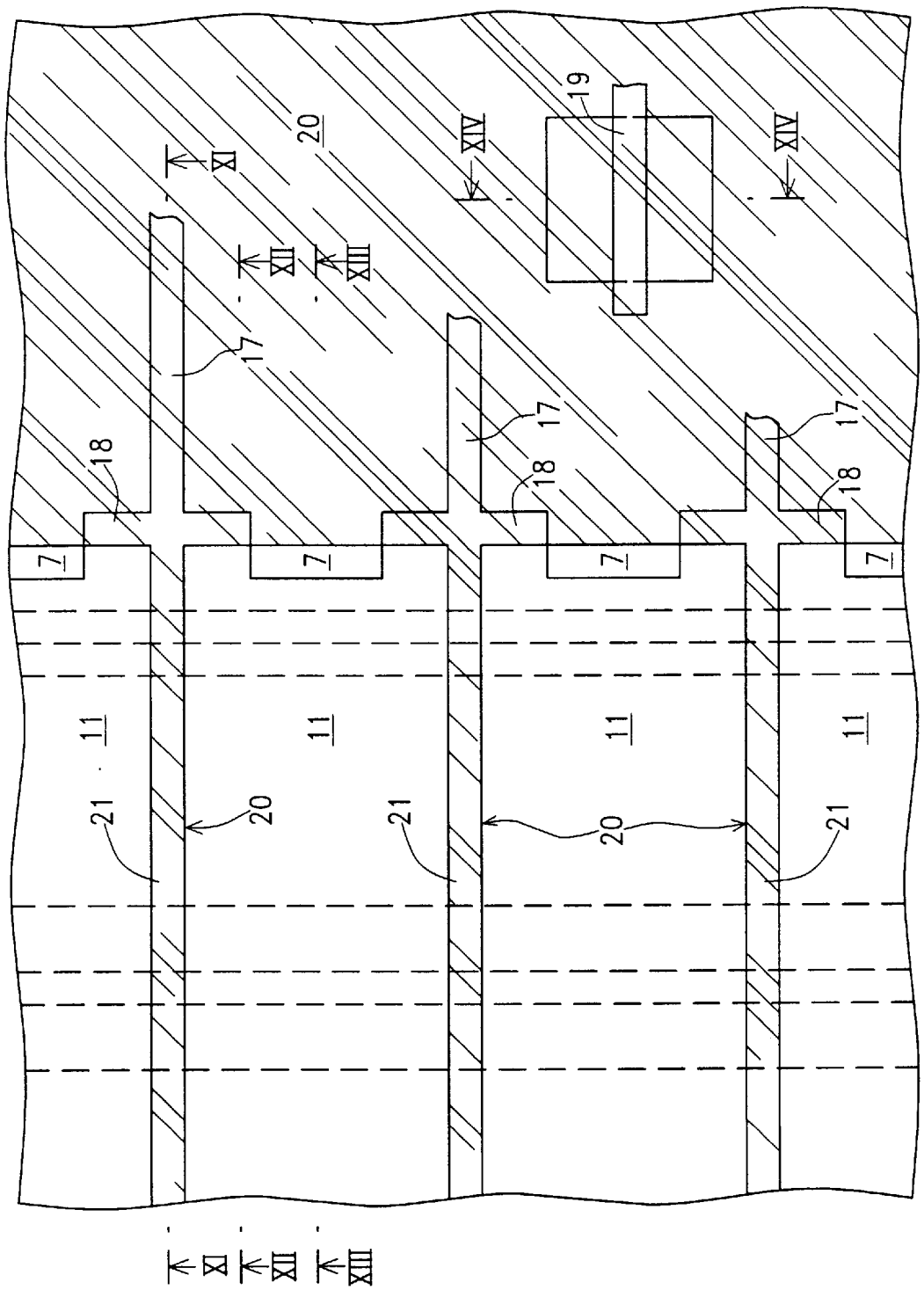

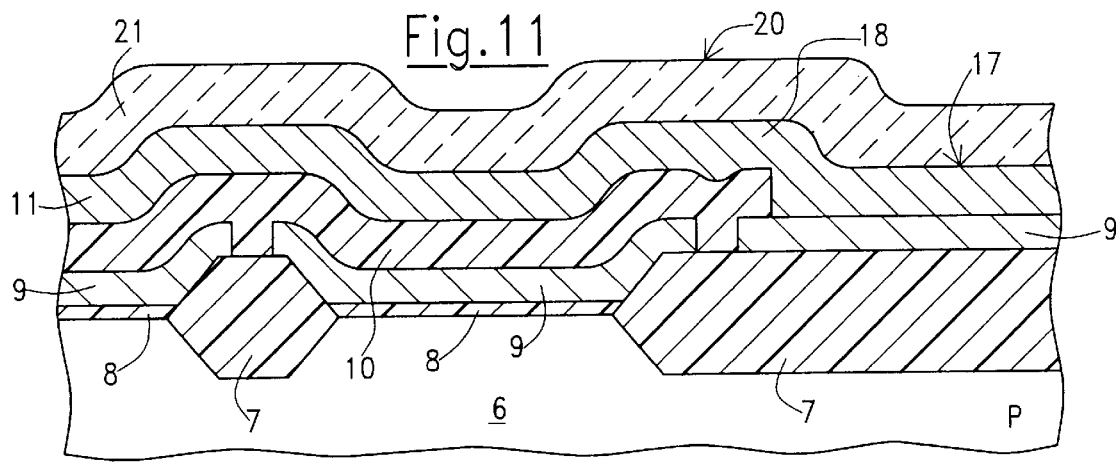
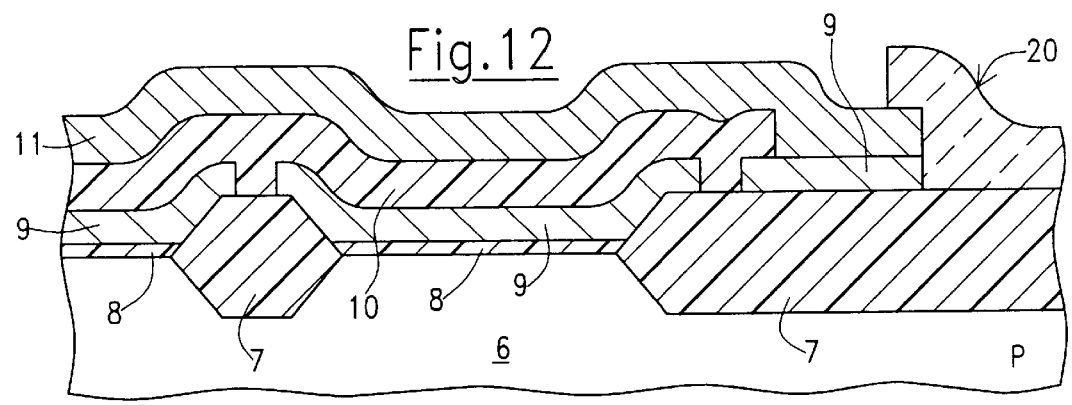
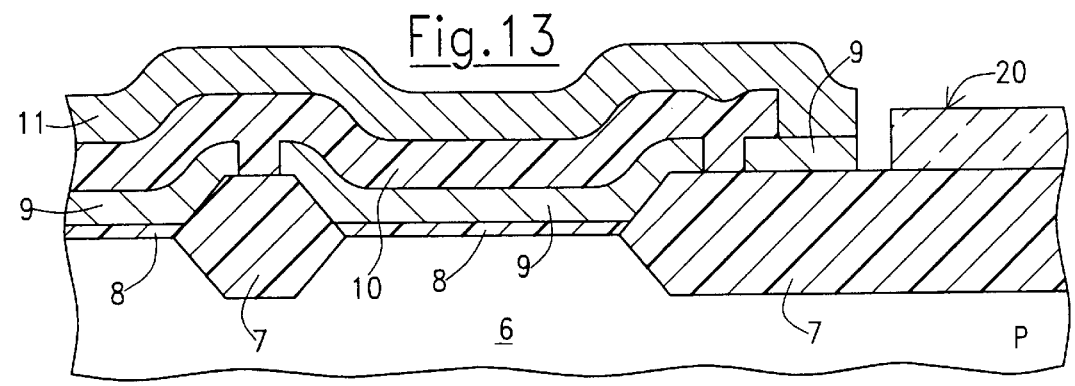
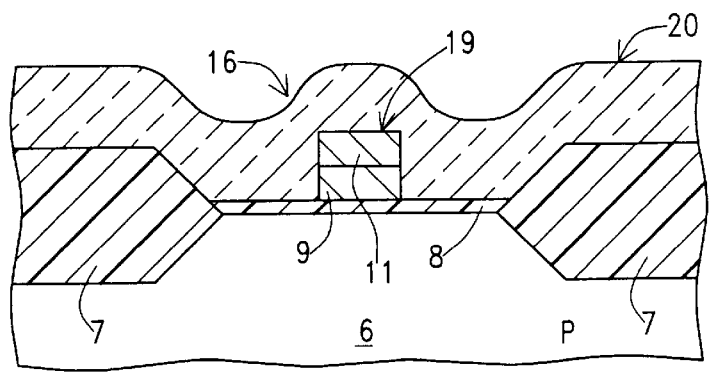

PROCESS FOR MANUFACTURING AN INTEGRATED CIRCUIT COMPRISING AN ARRAY OF MEMORY CELLS

DESCRIPTION

The present invention relates to a process for manufacturing an integrated circuit comprising an array of memory cells, such as for example an array of electrically-programmable non-volatile memory cells (EPROM, Flash EEPROM or EEPROM memory cells).

It is known that most semiconductor memory cells, particularly electrically-programmable non-volatile memory cells, are formed by stacked-gate MOS transistors having a floating gate electrode and a control gate electrode. Typically, the floating gate electrode and the control gate electrode are obtained from two different layers of conductive material, such as polysilicon, isolated by means of a dielectric layer (interpoly dielectric).

An integrated circuit comprising an array of memory cells always comprises several other circuit blocks containing MOSFETs. As known, MOSFETs comprise only one gate electrode, also typically made of polysilicon. For example, row decoder circuits are needed for selecting specific rows of memory cells inside the memory cell array. The drivers of the row decoder circuits must be electrically connected to the rows of the array. Normally, polysilicon strips are used as interconnection lines between the drivers of the row decoder and the rows of the array. The use of polysilicon strips as interconnection lines instead of metal lines is advantageous because in this way it is normally possible to reduce the number of different metal layers to be formed, and the manufacturing processes are consequently greatly simplified.

Known processes for manufacturing integrated circuits comprising an array of memory cells as well as conventional MOSFETs provides for forming, on active areas of a common semiconductor substrate, a gate oxide layer which will form the gate oxide of both the memory cells and the MOSFETs of the circuitry; forming on the whole substrate (and thus also on the gate oxide layer) a first layer of polysilicon, forming over the first polysilicon layer a layer of dielectric material (interpoly dielectric); selectively removing the interpoly dielectric in regions of the substrate wherein the MOSFETs of the circuitry are to be formed, thus leaving the interpoly dielectric only in the region of the memory cell array; forming a second layer of polysilicon over the whole substrate, so that in the region of the memory cell array the second polysilicon layer is separated from the first polysilicon layer by the interpoly dielectric, while in the region of the circuitry the second polysilicon layer is directly superimposed over the first polysilicon layer ("double polysilicon in short-circuit").

The gate electrodes of the MOSFETs of the circuitry and the control gate electrodes (rows of the memory cell array) are then simultaneously defined.

To this purpose, a first layer of photoresist is deposited over the second layer of polysilicon. The first layer of photoresist is selectively exposed to light by means of a first mask and the first layer of photoresist is selectively removed. The second polysilicon layer is then selectively removed where it is not covered by the first photoresist layer. Using an etching process suitable for removing the polysilicon but not the oxide and the interpoly dielectric, in the regions of the substrate dedicated to the circuitry, where the first and second layers of polysilicon are in direct contact, both the second and the first layer of polysilicon are simultaneously etched down to the gate oxide layer; in the region of the substrate dedicated to the memory cell array only the second level of polysilicon is removed down to the interpoly dielectric layer.

Without removing the first layer of photoresist, a second layer of photoresist is deposited over the whole chip. The second layer of photoresist is then selectively exposed to light by means of a second mask, and the second photoresist layer is selectively removed from the region of the chip wherein the memory cell array is to be formed. Thus, the region of the chip dedicated to the circuitry is completely covered by the second layer of photoresist, while in the region for the array only isles of the first photoresist layer (defined by means of the first mask) are left. Then, the interpoly dielectric layer, the first layer of polysilicon and the gate oxide layer are selectively removed to define the floating gates and the gate oxide of the memory cells, i.e. to completely define the rows of the memory cell array.

The use of two layers of photoresist has shown to be critical: during the selective removal of the second layer of photoresist it may happen that portions of the first layer of photoresist in the region of the memory cell array are also removed; if this happens, the silicon wafers are to be discarded, with significant impact on the manufacturing yield.

In order to overcome this problems, an alternative process has been proposed that after the second layer of polysilicon has been deposited provides for depositing a first layer of photoresist; selectively removing it from the area of the chip reserved to the circuitry while leaving all the area for the memory cell array covered by the first photoresist layer; etching the second and the first polysilicon layers down to the gate oxide to define the gates of the MOSFETs of the circuitry; completely removing the first photoresist layer; depositing a second photoresist layer; selectively removing the second photoresist layer from the area reserved to the memory cell array while leaving the area for the circuitry covered; and then selectively removing the second layer of polysilicon, the interpoly dielectric, the first layer of polysilicon and the gate oxide layer for defining the rows of the memory cell array and the gates of the memory cells in the memory cell array.

In this process, the photolithographic mask used for selectively removing the first photoresist layer and the photolithographic mask used for selectively removing the second photoresist layer are not overlapping; in other words, all around the memory cell array the second polysilicon layer is completely removed. In this way, however, the rows of the memory cell array and the interconnection lines between the rows and the circuitry, such as the row decoder, both formed in the second layer of polysilicon, are disconnected from each other. It is thus necessary to provide metal jumpers for connecting the ends of the rows of the memory cell array to respective ends of the interconnection lines outside the memory cell array, for example coming from the row decoder. This is disadvantageous, because for each row two contacts are to be provided, so that not only the number of contacts increases enormously (especially for memories of large sizes), but also the provision of contacts does not allow to reduce the spacing between the rows. Additionally, the larger the number of contacts to be provided, the higher the probability of defects, and the resulting manufacturing yield decreases.

In view of the state of the art described, it is an object of the present invention that of providing a process for manufacturing an integrated circuit comprising an array of memory cells suitable for overcoming the drawbacks of the known processes.

According to the invention, such object is attained by means of a process for manufacturing an integrated circuit comprising an array of memory cells, providing for:

a) forming in a memory cell array area of a semiconductor layer an active area for the memory cells;

b) forming over said active area for the memory cells a gate oxide layer;

c) forming over the whole integrated circuit a first layer of conductive material;

d) forming over the first layer of conductive material a layer of insulating material;

e) removing the layer of insulating material from outside the memory cell array area;

f) forming over the whole integrated circuit a second layer of conductive material which in the memory cell array area is separated from the first layer of conductive material by the insulating material layer, while outside the memory cell array area is directly superimposed over said first layer of conductive material;

g) inside the memory cell array area, defining first strips of the second layer of conductive material for forming rows of the memory cell array, and outside the memory cell array area defining second strips of the second layer of conductive material for forming interconnection lines for electrically interconnecting the rows of the memory cell array with a circuitry, said defining the second strips providing for selectively etching the first and second layers of conductive material outside the memory cell array area by means of a first mask, and said defining the first strips providing for selectively etching the second layer of conductive material, the layer of insulating material and the first layer of conductive material inside the memory cell array area by means of a second mask;

characterized in that the first and second masks overlap in a boundary region around the memory cell array area, so that the first strips and the second strips of the second layer of conductive material are automatically joined at respective ends thereof at said boundary region.

Thanks to the present invention, it is possible to form interconnection lines which are automatically joined to the rows of the memory cell array, so that it is not necessary to provide metal jumpers for connecting the interconnection lines to the rows of the memory cell array. Additionally, the process of the invention is not critical because it does not provide for using two superimposed layers of photoresist.

These and other features and advantages of the invention will be made apparent by the following detailed description of some particular embodiments, described as non-limiting examples in the annexed drawings, wherein:

FIG. 1 is a schematic diagram of an integrated circuit comprising an array of memory cells; and FIGS. 2 to 18 show in top-plan views and in cross-sectional views a portion of the integrated circuit at intermediate steps of a manufacturing process according to the present invention.

In FIG. 1 there is schematically shown part of an integrated circuit comprising an array of memory cell, for example an electrically-programmable non-volatile semiconductor memory device, that will help understanding the technical problem underlying and the features of the present invention. Conventionally, the memory device comprises an array 1 of memory cells 2, formed for example by stacked-gate MOS transistors, arranged in rows 3 and columns 4. Control gate electrodes of the stacked-gate MOS transistors 2 are connected to respective rows 3, while drain electrodes of the stacked-gate MOS transistors 2 are connected to respective columns 4. In order to select the rows, a row decoder circuit 5 is provided, that is supplied by row address signals RADD. The row decoder circuit 5 decodes the row address signals RADD and correspondingly activates one of a plurality of row selection signals RS, the number thereof is equal to the number of rows 3. Each row selection signal RS supplies a respective row driver RD the output thereof drives a respective row 3.

As mentioned, the memory cells are stacked-gate MOS transistors, having a floating-gate electrode and a control gate electrode respectively formed from two distinct layers of conductive material, typically polysilicon. Conventionally, the rows 3 of the array are formed by strips of the same polysilicon layer forming the control gates of the stacked-gate MOS transistors 2. The polysilicon strips forming the rows 3 of the array must be electrically connected to the row drivers RD outside the memory array 1. Thus, electrical interconnection lines 100 are to be provided for electrically connecting the rows 3 of the array 1 to the row drivers RD.

The present invention deals with the problem of forming the interconnection lines 100.

A first embodiment of the process according to the present invention will now be described.

Referring to FIGS. 2 to 5, a portion of a semiconductor chip wherein the memory device of FIG. 1 is integrated is shown, at an intermediate step of its manufacturing. Over a P-type semiconductor layer 6 thick field oxide areas 7 and thin gate oxide areas 8 are formed. The thick field oxide areas 7 are selectively formed over layer 6 for example by means of conventional LOCOS technique. The areas of the surface of layer 6 not covered by the field oxide 7 are covered by the gate oxide 8 and define the so-called "active areas" wherein the memory cells and other devices (for example MOSFETs for the circuitry external to the memory cell array) are to be formed. The gate oxide layer 8 is in current technology approximately 200 Å thick and will form the gate oxide of both the memory cells and the MOSFETs of the circuitry.

The field oxide 7 surrounds the area of the chip wherein the memory cell array is to be formed. Also, according to a known manufacturing process, at this step of the process substantially parallel strips of field oxide 7 are also formed inside the memory cell array area. Thus, complementary strips of gate oxide 8 are provided inside the memory matrix area between the strips of field oxide. The provision of strips of field oxide inside the memory cell array area is however not a limitation of the present invention: it would also be possible to form substantially rectangular areas of field oxide in the memory cell array area.

Conventionally, a first layer of polysilicon 9 is formed over the whole chip surface. The first polysilicon layer 9 is doped with, e.g., phosphorus for reducing the resistivity thereof.

The first polysilicon layer 9 is then selectively removed by means of a photolithographic technique for forming strips of first polysilicon layer 9 over the strips of gate oxide 8 inside the memory cell array area. Outside the memory cell array area, the first polysilicon layer 9 is not removed.

The first polysilicon layer 9 will form the floating gates of the memory cells.

Then, a dielectric layer 10 is formed over the whole surface of the chip. The dielectric layer 10 will form the interpoly dielectric separating the floating gate and the control gate of the memory cells. The interpoly dielectric layer 10 can be a layer of oxide or, preferably, a composite stack of dielectric layers (e.g., Oxide-Nitride-Oxide); this is however not relevant to the invention.

The interpoly dielectric layer 10 is then selectively etched and removed outside the memory cell array area.

Then a second layer of polysilicon 11 is deposited over the whole chip. The second polysilicon layer 11 is doped with, e.g., phosphorus for reducing its resistivity. A silicide layer (not shown in the drawings for the sake of simplicity) can also be formed over the second polysilicon layer 11 for further reducing the resistivity thereof. Inside the memory cell array the second polysilicon layer 11 is separated from the first polysilicon layer 9 by the interpoly dielectric layer 10. Outside the memory cell array, the second polysilicon layer 11 is in direct contact with the first polysilicon layer 9 (double polysilicon in short-circuit). Outside the memory cell array, the first and second polysilicon layers 9, 11 will form the gate electrodes of the MOSFETs of the circuitry.

The process steps described up to now are conventional.

Figure 2:
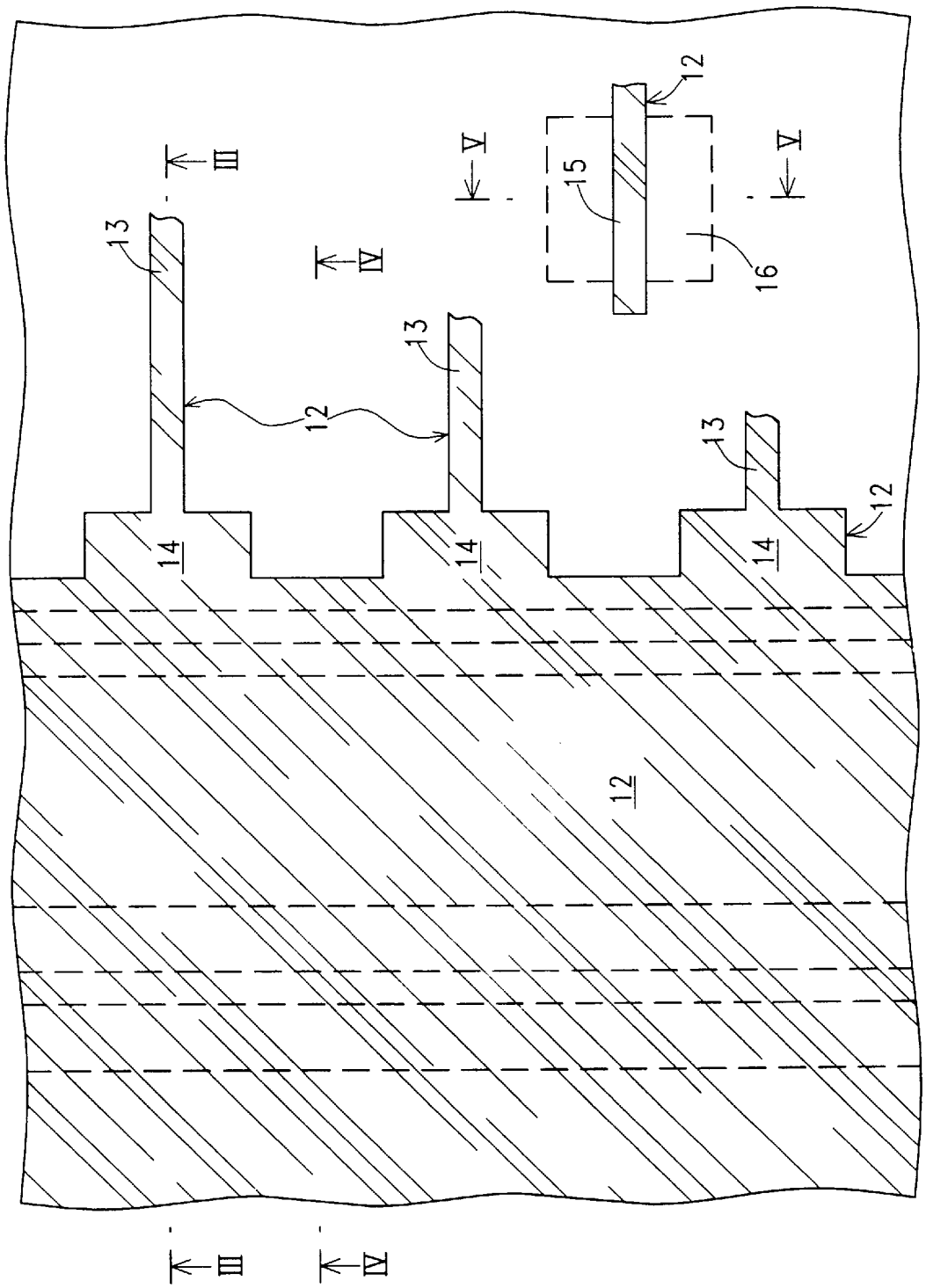
Figure 3:
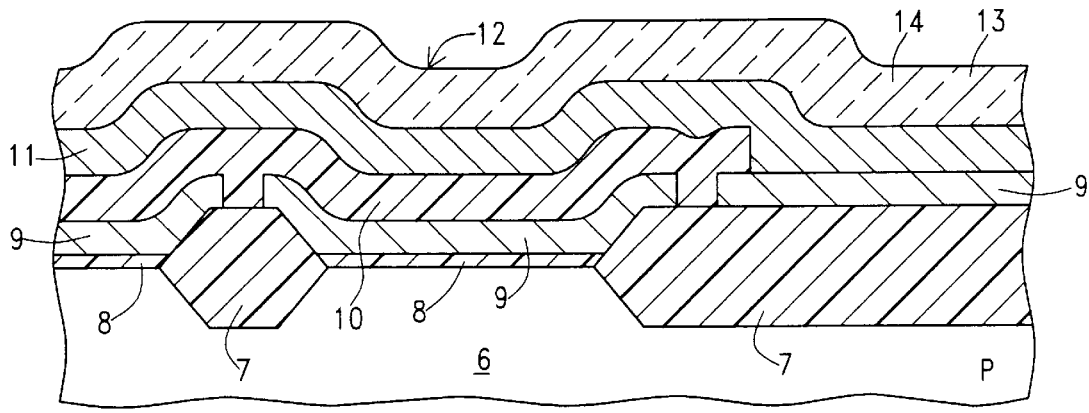
Figure 4:
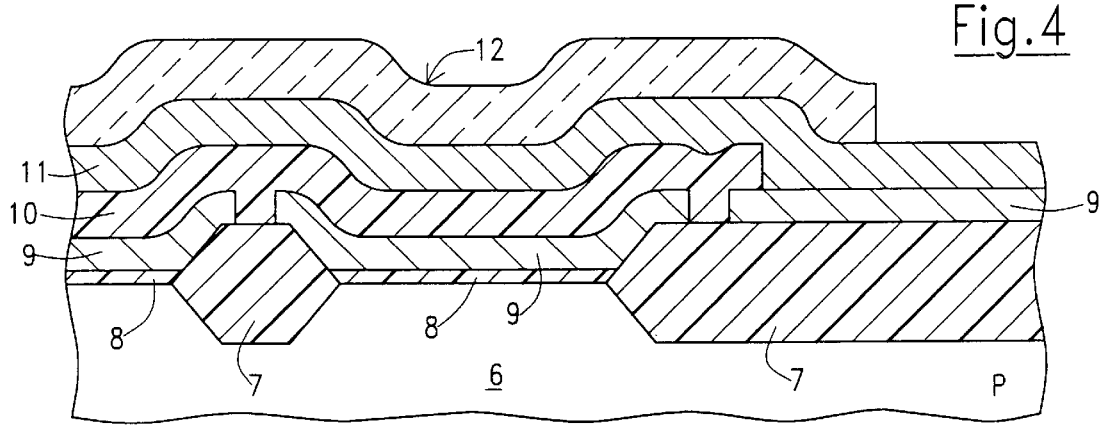
Figure 5:
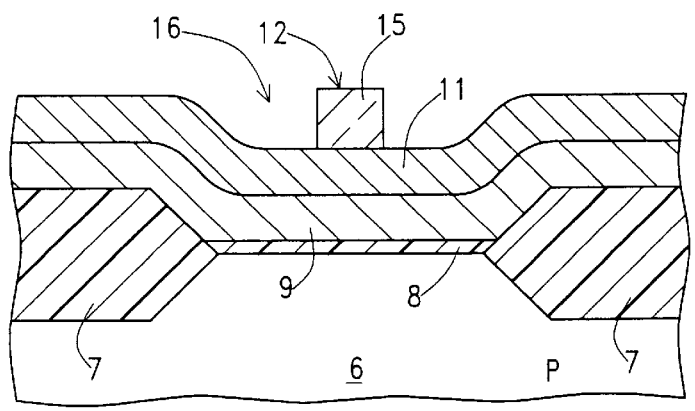
Figure 6:
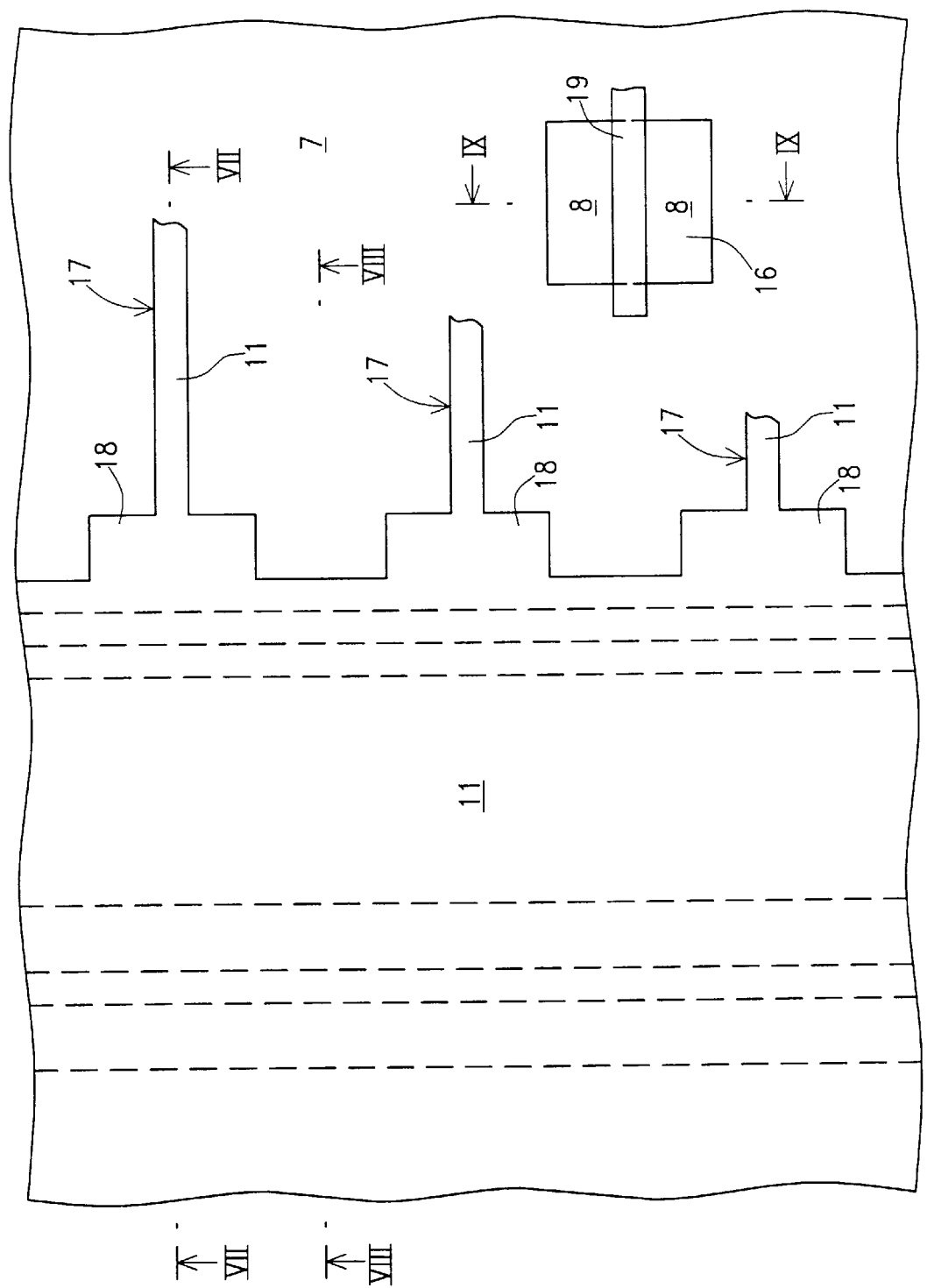
Figure 7:
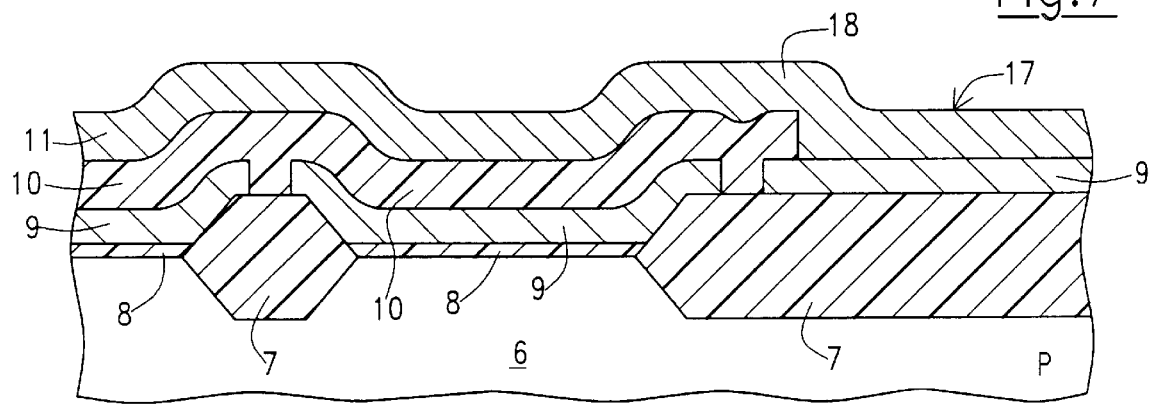
Figure 8:
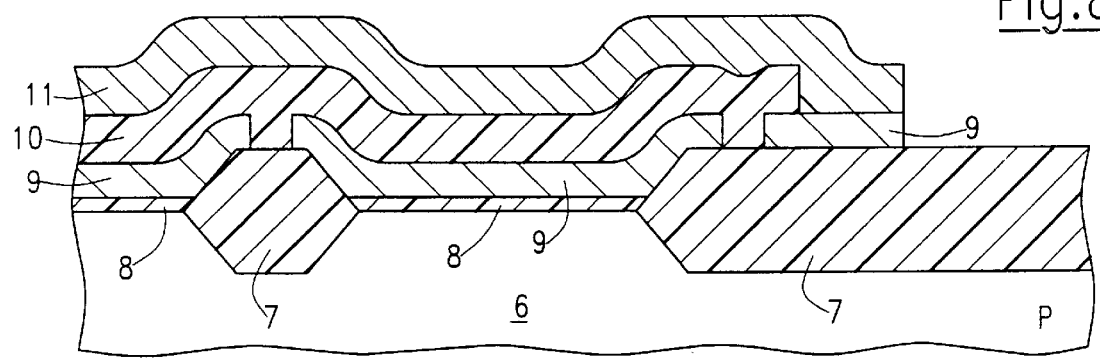
Figure 9:
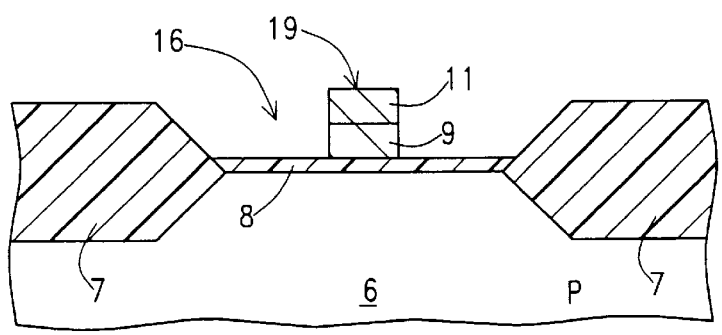

According to the present invention, a photoresist layer 12 is then deposited over the whole chip. By means of a photolithographic technique involving the use of a first photolithographic mask (in the following referred to as "MASK1")the photoresist layer 12 is selectively removed from over the chip surface. The layout of the photoresist layer 12 after it has been selectively removed is clearly visible in FIG. 2. All the memory cell array area is covered by a plate of photoresist layer 12. Outside the memory cell array, over the field oxide 7 surrounding the memory cell array, photoresist strips 13 are left. The photoresist strips 13 are joined to the photoresist plate covering the memory cell array through enlarged photoresist pads 14. In FIG. 2 there is also shown a photoresist strip 15 left over a portion of active area 16 outside the memory cell array area, wherein an N-channel MOSFET of the circuitry will be formed. Similarly, photoresist strips are left over portions of active areas outside the memory cell array wherein P-channel MOSFETs will be formed.

Referring now to FIGS. 6 to 9, selective etching of the second and first polysilicon layers 9, 11 down to the oxide layers 7 and 8 is then performed outside the memory cell array area, where the first photoresist layer 12 has been removed. Then, the first photoresist layer 12 is completely removed. In this way, strips 17 in the short-circuited second and first polysilicon layers 9, 11 are defined. The memory cell array area, masked during etching by the photoresist plate 12, is not affected by the etching process. The first and second polysilicon layers 9, 11 forming the strips 17 are joined to the corresponding layers 9 and 11 in the memory cell array area through enlarged pads 18 defined in layers 9 and 11. Also, in the active area portion 16 outside the memory cell array area a strip 19 in the short-circuited first and second polysilicon layers 9, 11 is defined which will form the gate of the N-channel MOSFET of the circuitry.

Referring now to FIGS. 10 to 14, another photoresist layer 20 is subsequently deposited over the whole chip. By means of another photolithographic technique involving the use of another mask (in the following referred to as "MASK2") the photoresist layer 20 is selectively removed from over the chip surface. The layout of the photoresist layer 20 after the selective removal is clearly visible in FIG. 10. A photoresist plate covers all the chip surface outside the memory cell array area. Inside the memory cell array area photoresist strips 21 are left, which extend over the field oxide 7 surrounding the memory cell array area. The strips 21 join the photoresist plate covering all the remaining of the chip surface. MASK2 is such that the edge of the photoresist plate covering all the chip with the exception of the memory cell array area falls inside the enlarged pads 18 previously defined in the first and second polysilicon layers 9, 11.

Figure 15:
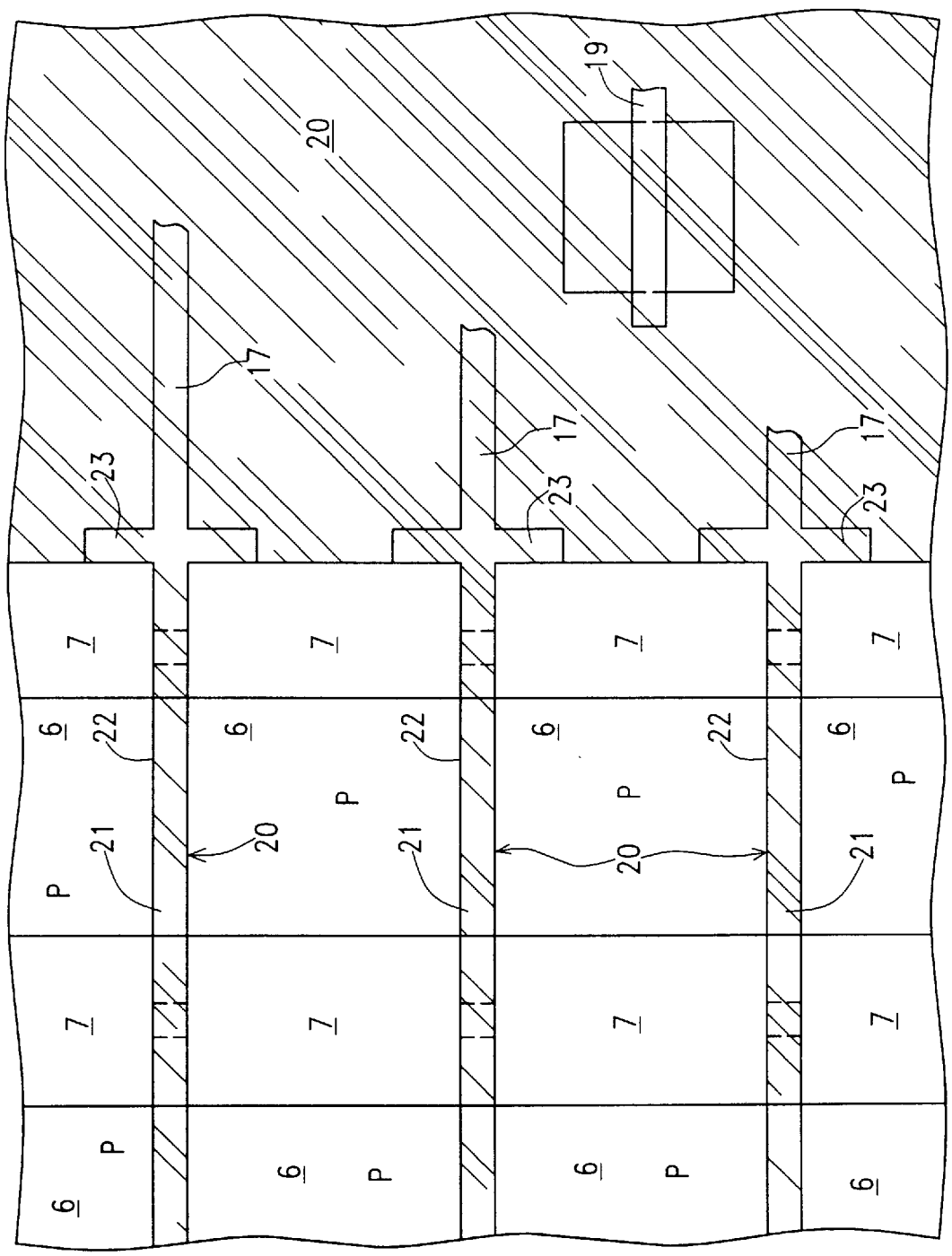

With reference to FIG. 15, selective etching of the second polysilicon layer 11, the interpoly dielectric layer 10, the first polysilicon layer 9 and the gate oxide layer 8 is then performed inside the memory cell array area using the photoresist layer 20 as a protective mask. In this way, strips 22 formed by the stack of layers 11, 10, 9, 8 are defined inside the memory cell array. The strips 22 in the second polysilicon layer 11 will form the rows of the memory cell array. As visible from FIG. 15, the strips 22 are joined to the previously defined strips 17 outside the memory cell array area through enlarged pads 23 formed in the second and first polysilicon layers 11, 9. This is the consequence of MASK1 having the enlarged pad areas 14, and MASK2 overlapping said enlarged pad areas 14 of MASK1; in other words, differently from the conventional manufacturing process, the two masks used for selectively etching the two polysilicon layers inside and outside the memory cell array are overlapping. Thanks to this, the polysilicon strips 22 inside the memory matrix automatically join the polysilicon strips 17 outside the memory matrix. This is one of the peculiar aspects of the present invention, because in this way it possible to form second polysilicon level interconnection lines without the need of providing two superimposed photoresist layers, and without having to provide metal jumpers connecting the polysilicon strips inside and outside the memory cell array.

Provision of the enlarged pad areas 14 is advantageous because they allow to obtain low-resistivity interconnection lines made from the second polysilicon layer 11 even in case of slight misalignment between MASK1 and MASK2.

It should be noted that it is not strictly necessary that the MASK1 is applied before MASK2 in the process flow, i.e. that the strips 17 outside the memory cell array are defined before the strips 22 inside the memory cell array. In fact, it is evident that it would be possible to define first the strips 22 inside the memory cell array, leaving the remaining of the chip unaltered, and then defining the strips 17 outside the memory cell array.

Similarly, the enlarged pad areas 18 could be formed not by means of MASK1, but by means of MASK2. It is however important that, in both cases, the enlarged pad areas 18 are formed over the field oxide 7 surrounding the memory array, and not over the active areas covered by the gate oxide layer 8, because in the latter case during the etching process the silicon layer 6 could be attacked too (as visible in FIG. 10, due to the particular alignment of the masks, areas of field oxide 7 whereover the first and second polysilicon layers 9, 11 were previously removed are exposed and undergo the etching process that allows to define strips 22; if said exposed areas were gate oxide areas, the thin gate oxide layer would be easily attacked and removed, and the underlying silicon layer 6 would be exposed to the etching reactants).

Figure 16:
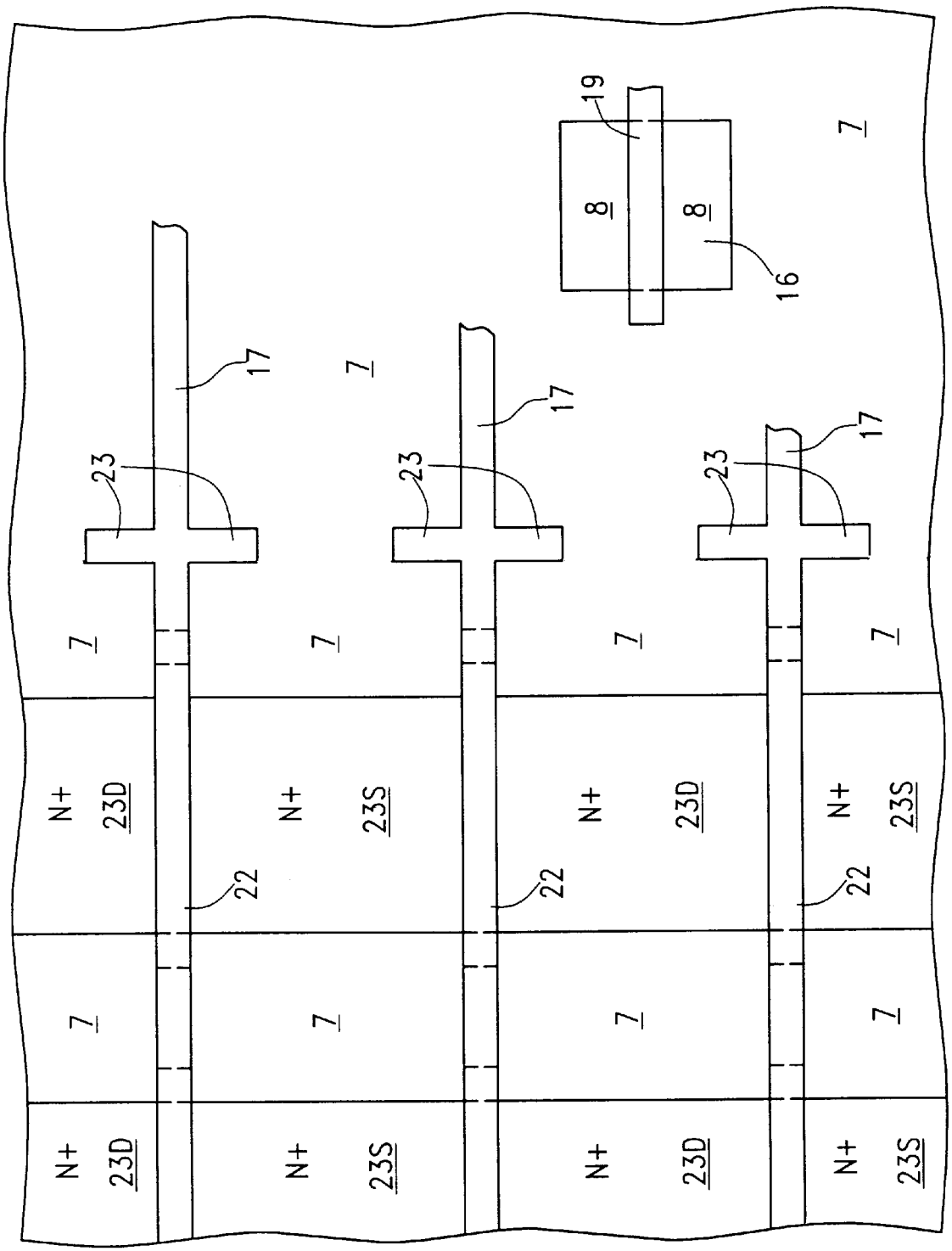

Without removing the second photoresist layer 20, an N type dopant, typically arsenic, is then selectively implanted in a dose of approximately $10^{15}$ atoms/cm$^2$ only in the memory cell array area to form in the substrate 6 N+ source and drain regions 23S, 23D for the memory cells, aligned with the edges of the rows (i.e., strips 22) of the memory cell array. Regions 23S, 23D are formed only where the field oxide 7 is absent. Then, the photoresist layer 20 is completely removed (FIG. 16).

Figure 17:
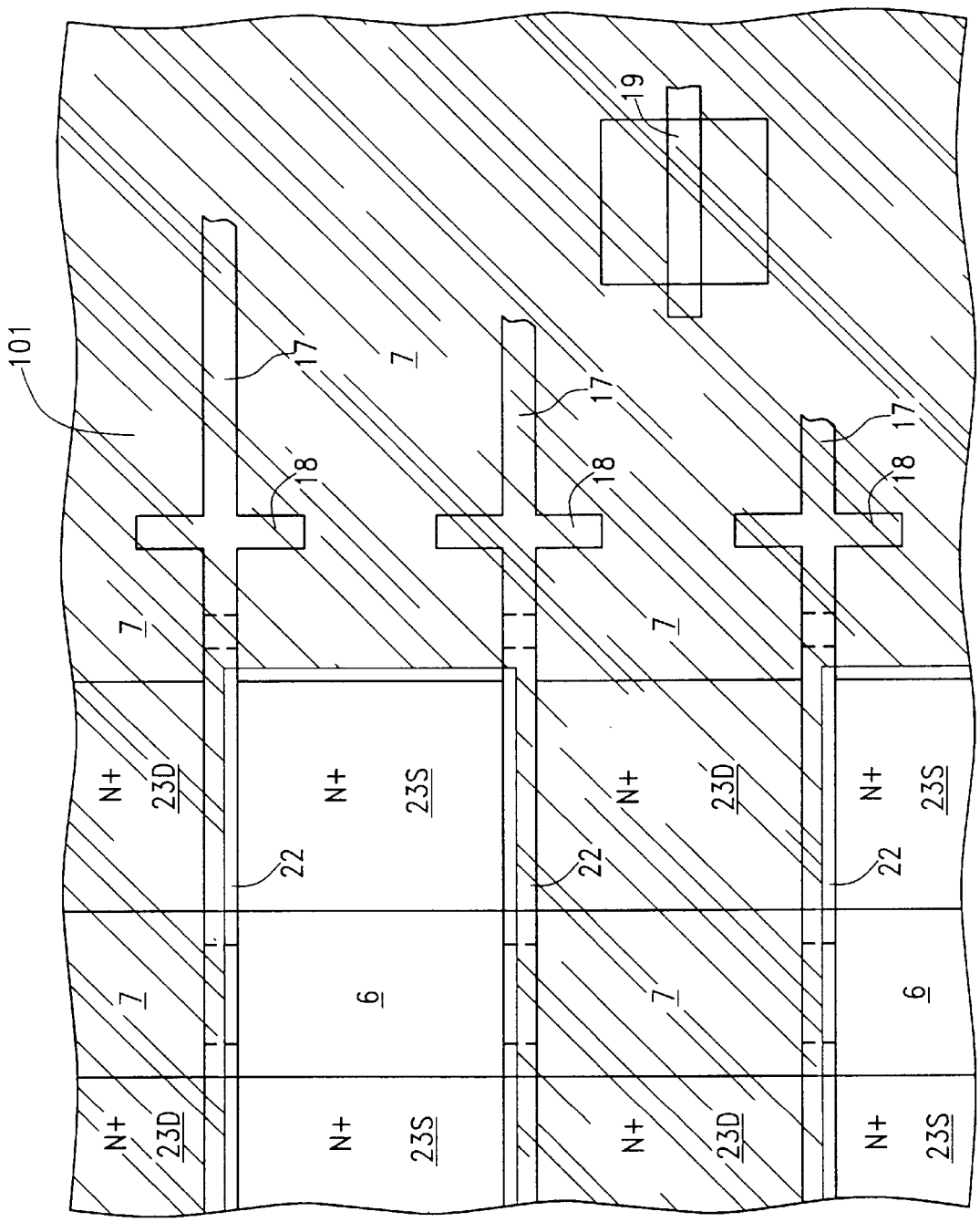

After this, another photoresist layer 101 is deposited and selectively removed by means of a so-called "Self-Aligned-Source" (SAS) mask. Then, the uncovered portions of the field oxide 7 inside the memory cell array area are selectively removed where common source diffusions for the memory cells will be formed (FIG. 17). The photoresist layer 101 covers the circuitry and the drain regions of the memory cells and the strips 22 (rows) of the memory cell array.

Figure 18:
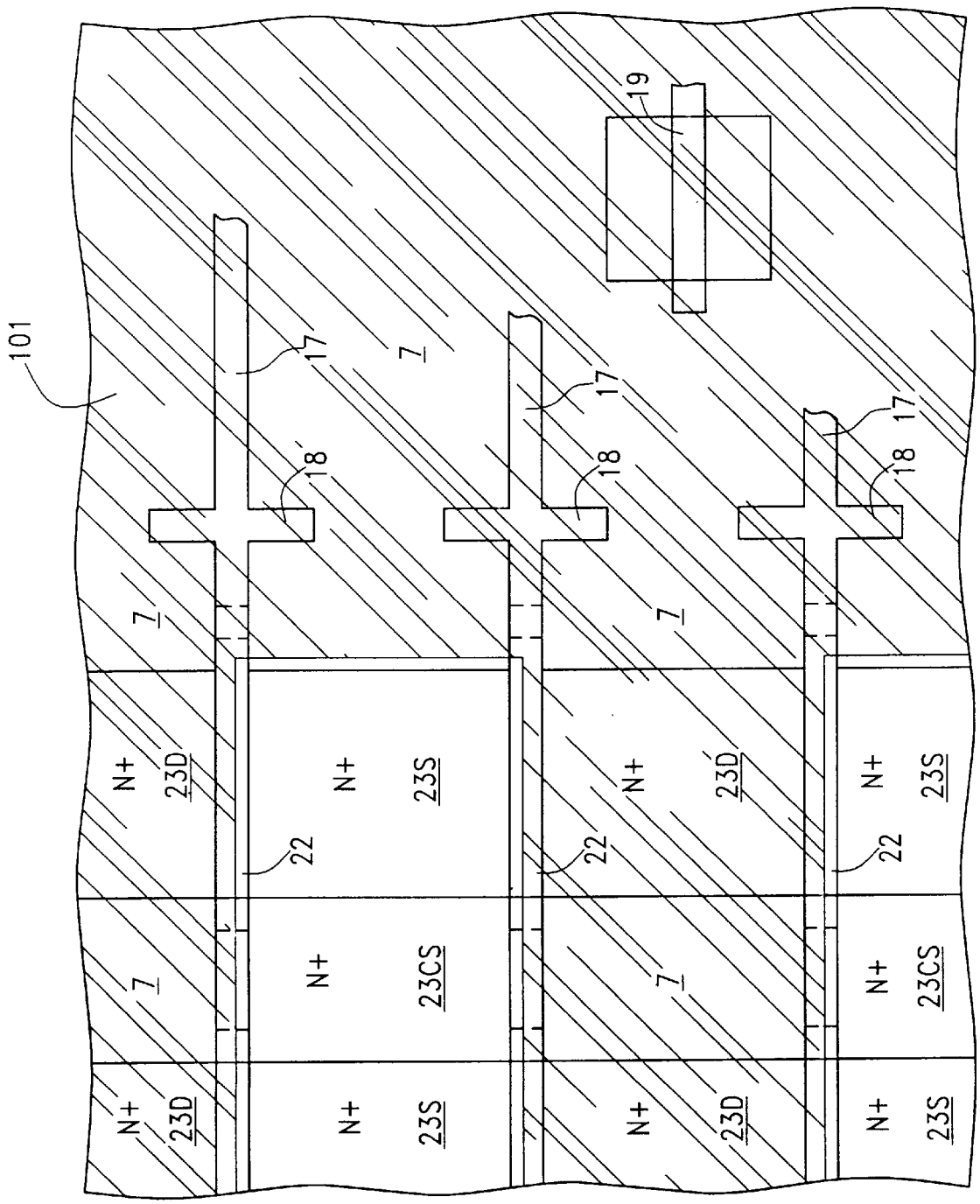

After the field oxide 7 has been selectively removed from the memory cell array area, an implant of an N-type dopant, typically arsenic, in a dose of approximately $10^{15}$ atoms/cm$^2$ is performed to form N+ regions 23CS which, together with source regions 23S, form common source diffusions for the memory cell array (FIG. 18).

Then the photoresist layer 101 is removed, and a thermal process is performed for diffusing the arsenic atoms previously implanted.

A low-dose implant (typically $10^{12}$ or $10^{13}$ atoms/cm$^2$) of an N type dopant is then performed to form N-type Lightly Doped Drain (N-LDD) regions for the N-channel MOSFETs of the circuitry. No mask is normally used to perform this implant.

A photoresist layer is then deposited, and it is selectively removed by means of a so-called "P-LDD mask". Such a mask covers all the memory cell array area, and also the active areas (e.g., active area 16) of the circuitry where N-channel MOSFET are to be formed. Then, a low dose of a P type dopant is implanted to form P-type LDD regions for the P-channel MOSFETs of the circuitry. The photoresist layer for the P-LDD implant is then removed.

Insulating sidewall spacers are then conventionally formed at the sides of the gate electrodes of the MOSFETs of the circuitry (e.g., srip 19), as well as at the sides of the rows of the memory cell array (strips 22).

A photoresist layer is then deposited, and it is selectively removed to expose the source and drain regions of the N-channel MOSFETs of the circuitry. Then, a heavy dose implant of an N-type dopant (e.g., arsenic in a dose of approximately $10^{15}$ atoms/cm$^2$) is performed to form heavily-doped N-type (N+) source and drain regions of the N-channel MOSFETs of the circuitry. Due to the presence of the sidewall spacers, the N+ source and drain regions of the N-channel MOSFETs do not extend to the edges of the gate electrodes, and an N– source and drain region is left under the spacers. The photoresist layer is then removed, and a thermal process is performed for diffusing the implanted dopant.

Similarly, for defining heavily-doped P-type source and drain regions of the P-channel MOSFETs, snother photoresist layer is then deposited, and it is selectively removed by means of a mask for exposing the source and drain regions of the P-channel MOSFETs of the circuitry. After this, a heavy dose of a P-type dopant is implanted to form P+ source and drain regions for the same. Again, due to the presence of the spacers, the P+ source and drain regions do not extend to the edges of the gates, and P– source and drain regions are left under the spacers.

The process then goes on conventionally with the deposition of a dielectric layer, the formation of contact holes therein, the formation of metal interconnection lines, and so on.

Preferably, the photoresist layer 20 is not removed after the definition of the strips 22 and the implantation of the N-type dopant for forming the N+ regions 23S, 23D. The photoresist layer for the SAS mask is then deposited over the photoresist layer 20, and the etching of the portions of field oxide 7 is performed. In this way, during the etching of the field oxide 7 the polysilicon strips 22 are covered by the photoresist layer 20, that protects the strips 22 from the etching reactants. It should in fact be noted that the SAS mask normally leaves the sides of the strips 22 uncovered, so that during the etching of the field oxide 7 the strips 22 are partially etched too, and this cause an increase in the resistance of the rows of the memory cell array.

In the embodiment of the process previously described, the two masks MASK1 and MASK2 for defining the strips 17, 19 and 22 are applied sequentially, i.e. one (either MASK1 or MASK2) immediately after the other.

In another embodiment of the process according to the invention, the two masks MASK1 and MASK2 are not applied sequentially. MASK1 is applied first, and the two polysilicon layers 9, 11 are selectively removed for defining the strips 17, 19 in the circuitry area. Then, the photoresist layer 12 is removed. However, before defining the strips 22 in the memory cell array area, the low-dose implant of the N-type dopant for forming the N-LDD source and drain regions of the N-channel MOSFETs is performed. The selective implant of the low dose of P-type dopant for forming the P-LDD source and drain regions for the P-channel MOSFETs is then performed. The memory cell array area is at this step still covered by the gate oxide layer 8, the first polysilicon layer 9, the interpoly dielectric layer 10 and the second polysilicon layer 11.

The insulating sidewall spacers are then formed at the sides of the gate electrodes of the MOSFETs of the circuitry. No sidewall spacers are formed in the memory cell array area, which is covered by a plate of second polysilicon layer. Then, the photoresist layer 20 is deposited and MASK2 is applied for selectively removing the photoresist layer 20. The strips 22 are then defined in the memory cell array area by means of the selective etching of layers 11, 10, 9, 8.

Preferably without removing the photoresist layer 20, the photoresist layer 101 for the SAS mask is deposited and selectively removed; portions of the field oxide 7 in the memory cell array area are then etched. At this step, only the portions of the chip where the N+ regions 23S, 23CS will be formed are not covered by the photoresist layer 101. Then, MASK2 is applied and the photoresist layer 101 selectively removed for exposing also the regions of the memory cell array where the N+ drain region 23D of the memory cells will be formed. Subsequently, the mask used in the previous process for the selective formation of the N+ source and drain regions of the N-channel MOSFETs is applied. Then, a high-dose implant of an N-type dopant (typically arsenic in a dose of $10^{15}$ atoms/cm$^2$) is performed, to simultaneously form the N+ source and drain regions 23S, 23D of the memory cells, the N+ common source lines 23CS of the memory cell array, and the N+ source and drain regions of the N-channel MOSFETs. Then the remaining of the photoresist layer 101 (and, if not previously removed, the remaining of the photoresist layer 20) is removed, and a thermal process is performed for diffusing the implanted dopant.

Then, a high dose of a P-type dopant is selectively implanted in the active areas for the P-channel MOSFETs of the circuitry, to form P+ source and drain for the P-channel MOSFETs.

The process then conventionally goes on with the deposition of a dielectric layer, the formation of contact opening therein, the formation of metal interconnection lines, etc.

Compared to the first embodiment of the process previously described, this second embodiment allows for eliminating two high-dose implant of an N-type dopant and one thermal diffusion process. In fact, the source and drain regions 23S, 23D of the memory cells, the common source lines 23CS of the memory cell array and source and drain regions of the N-channel MOSFETs are formed by means of the same implant. Eliminating one thermal diffusion process allows for an increase in the effective length of the memory cells, so that it is possible to reduce the memory cell area. Another advantage of the process according to the second embodiment of the invention is the following. The insulating sidewall spacers are formed in the circuitry area when the memory cell array area is still covered by the second polysilicon layer, while in the first embodiment of the process the spacers are formed simultaneously in the circuitry and memory cell array areas. Formation of the sidewall spacers in the memory cell array area is not strictly necessary, but cannot be avoided in the first embodiment of the process. The formation of the spacers conventionally provides for forming an oxide layer over the whole chip, and then performing an etching so that the oxide layer is left only at the sides of steps. In the first embodiment of the process, etching of the oxide layer forming the spacers causes a thinning of the field oxide layer in the memory cell array area, which can cause problems. According to the second embodiment of the process instead, during etching of the oxide layer for forming the spacers the memory cell array is still covered by the second polysilicon layer, and the field oxide is not affected.

Several other embodiments of the present invention can obviously be devised by the skilled persons, all however falling within the scope defined in the appended claims.

We claim:

1. Process for manufacturing an integrated circuit comprising an array of memory cells, providing for:
    a) forming in a memory cell array area of a semiconductor layer an active area for the memory cells;
    b) forming over said active area for the memory cells a gate oxide layer;
    c) forming over the whole integrated circuit a first layer of conductive material;
    d) forming over the first layer of conductive material a layer of insulating material;
    e) removing the layer of insulating material from outside the memory cell array area;
    f) forming over the whole integrated circuit a second layer of conductive material which in the memory cell array area is separated from the first layer of conductive material by the insulating material layer, while outside the memory cell array area is directly superimposed over said first layer of conductive material;
    g) inside the memory cell array area, defining first strips of the second layer of conductive material for forming rows of the memory cell array, and outside the memory cell array area defining second strips of the second layer of conductive material for forming interconnection lines for electrically interconnecting the rows of the memory cell array with a circuitry, said defining the second strips providing for selectively etching the first and second layers of conductive material outside the memory cell array area by means of a first mask, and said defining the first strips providing for selectively etching the second layer of conductive material, the layer of insulating material and the first layer of conductive material inside the memory cell array area by means of a second mask;
    wherein the first and second masks overlap in a boundary region around the memory cell array area, so that the first strips and the second strips of the second layer of conductive material are automatically joined at respective ends thereof at said boundary region.

2. Process according to claim 1, wherein step g) provides for:
    g1) forming a first protective material layer over the whole integrated circuit;
    g2) selectively removing the first protective material layer from outside the memory cell array area by means of said first mask to leave outside the memory cell array area third strips of the first protective material layer while leaving the memory cell array area completely covered by the first protective material layer;
    g3) selectively removing the first and second conductive material layers where they are not covered by the first protective material layer to form said second strips;
    g4) removing the first protective material layer;
    g5) forming over the whole integrated circuit a second protective material layer;
    g6) selectively removing the second protective material layer from inside the memory cell array area by means of said second mask to leave inside the memory cell array area fourth strips of the second protective material layer extending to said boundary region and substantially overlapping at ends thereof respective ends of said second strips;
    g7) selectively removing the second layer of conductive material, insulating material layer and the first layer of conductive material where they are not covered by the second protective material layer, to form said first strips having ends automatically joined with respective ends of the second strips.

3. Process according to claim 1, wherein in said boundary region the first layer of conductive material and the second layer of conductive material are superimposed over a field oxide layer.

4. Process according to claim 3, further comprising providing for forming, where said ends of the first strips joins to respective ends of the second strips, enlarged junction areas in the second layer of conductive material.

5. Process according to claim 4, wherein said enlarged junction areas are formed by providing, by means of said first mask, enlarged protective material areas of the first protective material layer at the ends of the third strips defined in the first protective material layer, said second mask partially overlapping said enlarged protective material areas.

6. Process according to claim 4, wherein said enlarged junction areas are formed by providing, by means of said second mask, enlarged protective material areas of the second layer protective material layer at ends of the fourth strips defined in the second protective material layer, said first mask partially overlapping said enlarged protective material areas.

7. Process according to claim 1, wherein step a) also provides for forming further active areas outside said memory cell array area for N-channel and P-channel MOSFETs of the circuitry, and in that step g2) further provides for leaving fifth strips of the first protective material layer over said further active areas, so that in step g3) gate electrodes of the MOSFETs are defined simultaneously with said second strips.

8. Process according to claim 7, further comprising, after step g7), the following steps:
    g8) forming heavily-doped source and drain regions for the memory cells of the memory cell array;
    g9) removing the second protective material layer;
    g10) forming at the sides of the gate electrodes of the N-channel MOSFETs lightly-doped N-type source and drain regions for the N-channel MOSFETs;

g11) forming at the sides of the gate electrodes of the P-channel MOSFETs lightly-doped P-type source and drain regions for the P-channel MOSFETs;

g12) forming insulating material sidewall spacers at the sides of the gate electrodes of the N-channel and P-channel MOSFETs, said spacers covering at least partially said lightly-doped source and drain regions;

g13) forming heavily-doped source and drain regions for the N-channel MOSFETs;

g14) forming heavily-doped source and drain regions for the P-channel MOSFETs.

9. Process according to claim 7, further comprising, after step g3) and before step g4), the following steps:

g31) forming lightly-doped N-type source and drain regions at the sides of the gate electrodes of the N-channel MOSFETs;

g32) forming lightly-doped P-type source and drain regions at the side of the gate electrodes of the P-channel MOSFETs;

g33) forming insulating material sidewall spacers at the sides of the gate electrodes of the N-channel and P-channel MOSFETs, said spacers covering at least partially the lightly-doped N-type and P-type source and drain regions of the N-channel and P-channel MOSFETs.

10. Process according to claim 8, further comprising after step g7), for forming heavily-doped source and drain regions for the memory cells of the memory cell array, heavily-doped source and drain regions for the N-channel MOSFETs, and heavily-doped source and drain regions for the P-channel MOSFETs.

11. Process according to claim 1, wherein said first and second layers of conductive material comprise each a polysilicon layer.

12. Process according to claim 11, wherein said second layer of conductive material comprises a silicide layer formed over the polysilicon layer.

13. Process for manufacturing an integrated circuit comprising an array of memory cells, providing for:

a) forming in a memory cell array area of a semiconductor layer an active area for the memory cells;

b) forming over said active area for the memory cells a gate oxide layer;

c) forming over the whole integrated circuit a first layer of conductive material;

d) forming over the first layer of conductive material a layer of insulating material;

e) removing the layer of insulating material from outside the memory cell array area;

f) forming over the whole integrated circuit a second layer of conductive material which in the memory cell array area is separated from the first layer of conductive material by the insulating material layer, while outside the memory cell array area is directly superimposed over said first layer of conductive material;

g) inside the memory cell array area, defining first strips of the second layer of conductive material for forming rows of the memory cell array, and outside the memory cell array area defining second strips for forming interconnection lines for electrically interconnecting the rows, said defining said first and second strips including providing mask means for selectively etching, said mask means provided at a boundary region around the memory cell array area, so that the first strips and the second strips are joined at respective ends thereof at said boundary region.

14. A process according to claim 13 wherein said step of defining the second strips includes providing for selective etching of the first and second layers of conductive material.

15. A process according to claim 14 wherein the etching of the first and second layers conductive material is by means of a first mask.

16. A process according to claim 15 wherein said step of defining the first strips includes providing for selective etching of the second layer of conductive material.

17. A process according to claim 16 wherein the etching of the second layer of conductive material is by means of a second mask.

18. A process according to claim 17 wherein said first and second masks are disposed to overlap at said boundary region.

19. A process according to claim 18 wherein step g) provides for:

g1) forming a first protective material layer over the whole integrated circuit;

g2) selectively removing the first protective material layer from outside the memory cell array area by means of said first mask to leave outside the memory cell array area third strips of the first protective material layer while leaving the memory cell array area completely covered by the first protective material layer;

g3) selectively removing the first and second conductive material layers where they are not covered by the first protective material layer, to form said second strips;

g4) removing the first protective material layer;

g5) forming over the whole integrated circuit a second protective material layer;

g6) selectively removing the second protective material layer from inside the memory cell array area by means of said second mask to leave inside the memory cell array area fourth strips of the second protective material layer extending to said boundary region and substantially overlapping at ends thereof respective ends of said second strips;

g7) selectively removing the second layer of conductive material, the insulating material layer and the first layer of conductive material where they are not covered by the second protective material layer, to form said first strips having ends automatically joined with respective ends of the second strips.

20. Process according to claim 18, wherein said boundary region the first layer of conductive material and the second layer of conductive material are superimposed over a field oxide layer.

21. Process according to claim 20, wherein providing for forming, where said ends of the first strips joins to respective ends of the second strips, enlarged junction areas in the second layer of conductive material.

22. Process according to claim 21, wherein said enlarged junction areas are formed by providing, by means of said first mask, enlarged protective material areas of the first protective material layer at the ends of the third strips defined in the first protective material layer, said second mask partially overlapping said enlarged protective material areas.

23. Process according to claim 21, wherein said enlarged junction areas are formed by providing, by means of said second mask, enlarged protective material areas of the second layer protective material layer at ends of the fourth strips defined in the second protective material layer, said first mask partially overlapping said enlarged protective material areas.

24. Process according to claim 19, wherein step a) also provides for forming further active areas outside said memory cell array area for N-channel and P-channel MOSFETs of the circuitry, and in that step g2) further provides for leaving fifth strips of the first protective material layer over said further active areas gate electrodes of the MOSFETs are defined simultaneously with said second strips.

25. Process according to claim 24, further comprising, after step g7), the following steps:

g8) forming heavily-doped source and drain regions for the memory cells of the memory cell array;

g9) removing the second protective material layer;

g10) forming at the sides of the gate electrodes of the N-channel MOSFETs lightly-doped N-type source and drain regions for the N-channel MOSFETs;

g11) forming at the sides of the gate electrodes of the P-channel MOSFETs lightly-doped P-type source and drain regions for the P-channel MOSFETs;

g12) forming insulating material sidewall spacers at the sides of the gate electrodes of the N-channel and P-channel MOSFETs, said spacers covering at least partially said lightly-doped source and drain regions;

g13) forming heavily-doped source and drain regions for the N-channel MOSFETs;

g14) forming heavily-doped source and drain regions for the P-channel MOSFETs.

26. Process according to claim 24, further comprising, after step g3) and before step g4), the following steps:

g31) forming lightly-doped N-type source and drain regions at the sides of the gate electrodes of the N-channel MOSFETs;

g32) forming lightly-doped P-type source and drain regions at the side of the gate electrodes of the P-channel MOSFETs;

g33) forming insulating material sidewall spacers at the sides of the gate electrodes of the N-channel and P-channel MOSFETs, said spacers covering at least partially the lightly-doped N-type and P-type source and drain regions of the N-channel and P-channel MOSFETs.

27. Process according to claim 25, further comprising, after step g7), for forming heavily-doped source and drain regions for the memory cells of the memory cell array, heavily-doped source and drain regions for the N-channel MOSFETs, and heavily-doped source and drain regions for the P-channel MOSFETs.

28. Process according to claim 19, wherein said first and second layers of conductive material comprise each a polysilicon layer.

29. Process according to claim 28, wherein said second layer of conductive material comprises a silicide layer formed over the polysilicon layer.

* * * * *